United States Patent
Lee

(10) Patent No.: US 9,741,283 B2
(45) Date of Patent: Aug. 22, 2017

(54) OVER-CURRENT CONTROL DEVICE AND ORGANIC LIGHT EMITTING DISPLAY DEVICE ADOPTING THE SAME

(71) Applicant: LG DISPLAY CO., LTD., Seoul (KR)

(72) Inventor: Juseok Lee, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 14/857,274

(22) Filed: Sep. 17, 2015

(65) Prior Publication Data
US 2016/0189599 A1 Jun. 30, 2016

(30) Foreign Application Priority Data
Dec. 24, 2014 (KR) .................. 10-2014-0188105

(51) Int. Cl.
| | |
|---|---|
| *G09G 5/00* | (2006.01) |
| *G09G 3/20* | (2006.01) |
| *G09G 3/00* | (2006.01) |
| *G09G 3/3225* | (2016.01) |
| *H05B 33/08* | (2006.01) |
| *G09G 3/3208* | (2016.01) |
| *H02H 3/087* | (2006.01) |
| *G01R 19/00* | (2006.01) |
| *G01R 31/26* | (2014.01) |

(52) U.S. Cl.
CPC .......... *G09G 3/2092* (2013.01); *G09G 3/006* (2013.01); *G09G 3/3208* (2013.01); *G09G 3/3225* (2013.01); *H02H 3/087* (2013.01); *H05B 33/089* (2013.01); *G01R 19/0092* (2013.01); *G01R 31/2635* (2013.01); *G09G 2330/025* (2013.01); *G09G 2330/028* (2013.01); *G09G 2330/04* (2013.01); *G09G 2330/045* (2013.01); *G09G 2330/12* (2013.01)

(58) Field of Classification Search
CPC ......... G09G 2330/02; G09G 2330/021; G09G 2330/045; G09G 3/3241; G09G 3/3233; G09G 3/325; G09G 3/3258; G09G 3/3208
USPC ................... 345/39, 44, 46, 76, 77, 211–213
See application file for complete search history.

(56) References Cited

U.S. PATENT DOCUMENTS

| | | | |
|---|---|---|---|
| 2008/0143655 A1* | 6/2008 | Ko ....................... | G09G 3/3291 345/82 |
| 2010/0156316 A1* | 6/2010 | Chang ................ | H05B 33/0818 315/294 |
| 2012/0256897 A1 | 10/2012 | Seo et al. | |
| 2012/0293562 A1 | 11/2012 | Park | |

(Continued)

*Primary Examiner* — Jennifer Nguyen
(74) *Attorney, Agent, or Firm* — Dentons US LLP

(57) ABSTRACT

Disclosed is to an over-current control device and an organic light emitting display device adopting a function of interrupting an over-current. To provide an over-current control device and a OLED device using the same, which allow a fast and reliable detection of an over-current, an over-current control device for detecting an over-current provided to an OLED is provided, comprising: an over-current identification unit adapted to compare a driving voltage on a supply line for driving the OLED with a reference voltage on a reference voltage line for identifying the over-current; an interruption unit connected between the supply line supplying the driving voltage and the pixel including the OLED for interrupting the power supply if the over-current identification unit recognizes an over-current flowing through the supply line.

16 Claims, 9 Drawing Sheets

(56) References Cited

U.S. PATENT DOCUMENTS

| | | | |
|---|---|---|---|
| 2013/0113773 A1* | 5/2013 | Lee | H05B 33/0815 |
| | | | 345/211 |
| 2013/0328854 A1 | 12/2013 | Ruan et al. | |
| 2014/0084792 A1 | 3/2014 | Oh et al. | |
| 2014/0176622 A1 | 6/2014 | Jung et al. | |
| 2016/0148564 A1* | 5/2016 | Kim | G09G 3/3233 |
| | | | 345/211 |

* cited by examiner

OVER-CURRENT CONTROL DEVICE AND ORGANIC LIGHT EMITTING DISPLAY DEVICE ADOPTING THE SAME

This application claims priority from and the benefit under 35 U.S.C. §119(a) of Korean Patent Application No. 10-2014-0188105, filed on Dec. 24, 2014, which is hereby incorporated by reference for all purposes as if fully set forth herein

BACKGROUND OF THE INVENTION

Field of the Invention

The present invention relates to an organic light emitting display device adopting a function of interrupting an over-current.

Description of the Prior Art

An organic light emitting display device, which is highly favored as a display device, has a high response rate, a high light-emitting efficiency, a high brightness, and a wide viewing angle by using an organic light emitting diode (OLED) that self-emits light.

The organic light emitting display (OLED) device has pixels including the organic light emitting diodes, which are arranged in a matrix, and controls the brightness of the pixels selected by scan signals according to gray-scale data.

The pixels of the organic light emitting display device further include data lines and gate lines, which cross with each other, transistors, and storage capacitors, which are connected with the gate and data lines.

The transistors included in the pixel include a driving transistor for driving the organic light emitting diode, which has characteristic parameters, such as a threshold voltage, the mobility, or the like.

Meanwhile, a driving voltage (VDD) for the driving transistor may apply an over-current which causes the device to be shut down and a fire to break out. Therefore, technology for detecting and interrupting the over-current of the driving voltage is required.

SUMMARY OF THE INVENTION

The present invention is directed to an over-current control device and a OLED device using the same, which allow a fast and reliable detection of an over-current.

An advantage of the present invention is to detect an over-current outside of the display panel to avoid that an over-current is entering the panel and flowing through the panel.

According to one aspect of the present invention an over-current control device is provided for detecting an over-current provided to an OLED, comprising: an over-current identification unit adapted to compare a driving voltage on a supply line for driving the OLED with a reference voltage on a reference voltage line for identifying the over-current; an interruption unit connected between the supply line supplying the driving voltage and the OLED for interrupting the power supply when the over-current identification unit recognizes an over-current flowing through the supply line.

The over-current control device may comprise a comparator having a first and second input and an output, wherein the first input is connected to the supply line and the second input is connected to the reference voltage line, and wherein the output of the comparator is connected with an input of the interruption unit.

A resistor is directly connected between the supply line carrying the driving voltage and the interruption unit.

The first input is connected to the supply line at the resistor to detect a voltage drop at the resistor on supply line.

Preferably, the comparator is an operational amplifier.

Preferably, the over-current control device may be located on a control board which is separated from the display panel. The control board directly receives the driving voltage on a supply line, without any further change or influence on the driving voltage by other units. By this direct supply, any change of the current flow might be reliably detected. The control board may be connected via a connection line or flexible board to a display panel comprising the OLED. Due to this physical separation of the control board and the display panel, it is avoided that the current flows for a noticeable time on the display panel. Thus, any damage on the display panel due to an over-current might be avoided.

Preferably, the interruption unit is realized as a PMOS or NMOS transistor.

Preferably, the supply voltage is supplied from an external host system to the display panel comprising the OLED via a control PCB.

Preferably, the control board may be directly connected to the supply line.

Preferably, the over-current control device further includes a reference voltage increasing/decreasing unit for adopting the reference voltage. Thus, an adaptation of the over-current is possible due to any external influences or due to different voltage values. So, also after manufacturing it is possible to reprogram the over-current detection. Furthermore, changed external conditions like temperature or drift due to long operation time might be considered for over-current detection.

Preferably, when the supply voltage on the supply line reaches the reference voltage or becomes lower than the reference voltage corresponding to the over-current, the over-current identification unit recognizes that the over-current flows through the supply line and then the interruption unit interrupts the power supply through the supply line.

Preferably, the over-current control device may include a resistor connected between the supply line and the interruption unit.

Preferably, the reference voltage is the voltage applied to the sensing transistor among the thin film transistors of the pixel.

Preferably, the over-current control device may comprise a reference voltage Increasing/decreasing unit for adopting the reference voltage.

According to another aspect of invention a display device is provided comprising: display panel having data lines and gate lines, wherein subpixels are disposed at crossings of the data lines and gate lines; at least one source driver integrated circuit for supplying data signals to the data lines; at least one gate driver integrated circuit for supplying scanning signals to the gate lines; a controller for controlling the source driver IC and the gate driver IC and an over-current controller as described above between a power supply line and the OLED.

Preferably, the sub-pixels include a driving transistor, an organic light emitting diode, a switching transistor, a storage capacitor and a sensing transistor, the driving transistor is connected between the supply line and the OLED and is controlled by a data voltage supplied to the gate of the driving transistor via the data line, wherein the sensing transistor is controlled by a sense signal to connect a reference voltage line with a node between the driving transistor and the OLED used for sensing a characteristic of the driving transistor.

Preferably, the reference voltage supplied to the second input of the comparator may be the voltage applied to the sensing transistor of the subpixel.

Preferably, the control board may comprise the controller for controlling the display panel.

Preferably, the driving voltage is provided from the control board to the display panel by passing through the data driver.

According to a further aspect a method for operating a display device is provided comprising an over-current control device and a display panel, wherein the method comprises the steps of: supplying a driving voltage on a supply line to a OLED of the display panel; identifying a voltage supplied to the display panel outside the display panel, wherein when the identified voltage reaches a reference voltage corresponding to the over-current or becomes lower than the reference voltage corresponding to the over-current, interrupting the power supply through the EVDD line outside of the display panel.

According to a further aspect an organic light emitting display device is provided comprising: display panel that includes a plurality of data lines in the first direction, a plurality of gate lines in the second direction, and pixels defined at the crossings of the data lines and the gate lines; a driving voltage supply line that applies a driving voltage to a driving transistor among thin film transistors for controlling the pixels; and an over-current controller that comprises an over-current identification unit that identifies the over-current of the display panel by a voltage drop of the driving voltage power line, and an interruption unit that, if the over-current is identified by the over-current identification unit, interrupts the voltage of the driving voltage supply line.

Preferably, the over-current identification unit takes the driving voltage supply line as a first input port, and the reference voltage line as a second input port, and the reference voltage is equal to or greater than the voltage of the driving voltage supply line, which drops due to the over-current in the display panel, and less than the driving voltage.

Preferably, the reference voltage is the voltage that is applied to a sensing transistor among the thin film transistors positioned at the pixels.

Preferably, one end of a sensing resistor is connected with the driving voltage supply line, and the other end thereof is connected with a source of a PMOS as the interruption unit, and the over-current identification unit is an OP-Amp in which the "−" terminal of the OP-Amp is connected with the other end of the sensing resistor, the "+" terminal of the OP-Amp is applied with the reference voltage, and an output terminal of the OP-Amp is connected with a gate node of the PMOS.

Preferably, one end of a sensing resistor is connected with the driving voltage power line, and the other end thereof is connected with a source of an NMOS as the interruption unit, and the over-current identification unit is an OP-Amp in which the "+" terminal of the OP-Amp is connected with the other end of the sensing resistor, the "−" terminal of the OP-Amp is applied with the reference voltage, and an output terminal of the OP-Amp is connected with a gate node of the NMOS.

According to a further aspect an control device is provided comprising: an over-current identification unit that identifies the over-current of the display panel by identifying a voltage drop of a driving voltage power line for applying a driving voltage to a driving transistor among thin film transistors for controlling pixels of the display panel; and an interruption unit that, if the over-current is identified by the over-current identification unit, interrupts the voltage of the driving voltage power line.

Preferably, the over-current identification unit takes the driving voltage power line as a first input port, and the reference voltage line as a second input port, and the reference voltage is equal to or greater than the voltage of the driving voltage power line, which drops due to the over-current in the display panel, and less than the driving voltage.

Preferably, the reference voltage is the voltage that is applied to a sensing transistor among the thin film transistors positioned at the pixels.

Preferably, one end of a sensing resistor is connected with the driving voltage power line, and the other end thereof is connected with a source of a PMOS as the interruption unit, and the over-current identification unit is an OP-Amp in which the "−" terminal of the OP-Amp is connected with the other end of the sensing resistor, the "+" terminal of the OP-Amp is applied with the reference voltage, and an output terminal of the OP-Amp is connected with a gate node of the PMOS.

Preferably, one end of a sensing resistor is connected with the driving voltage power line, and the other end thereof is connected with a source of an NMOS as the interruption unit, and the over-current identification unit is an OP-Amp in which the "+" terminal of the OP-Amp is connected with the other end of the sensing resistor, the "−" terminal of the OP-Amp is applied with the reference voltage, and an output terminal of the OP-Amp is connected with a gate node of the NMOS.

Preferably, the over-current controller further comprises a reference voltage increasing/decreasing unit that increases or decreases the reference voltage.

Additional features and advantages of the invention will be set forth in the description which follows, and in part, will be apparent from the description or may be learned by practice of the invention. It is to be understood that both the forgoing general description and the following detailed description are exemplary and explanatory and are intended to provide further explanation of the invention claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EXEMPLARY EMBODIMENTS

Figure 1:
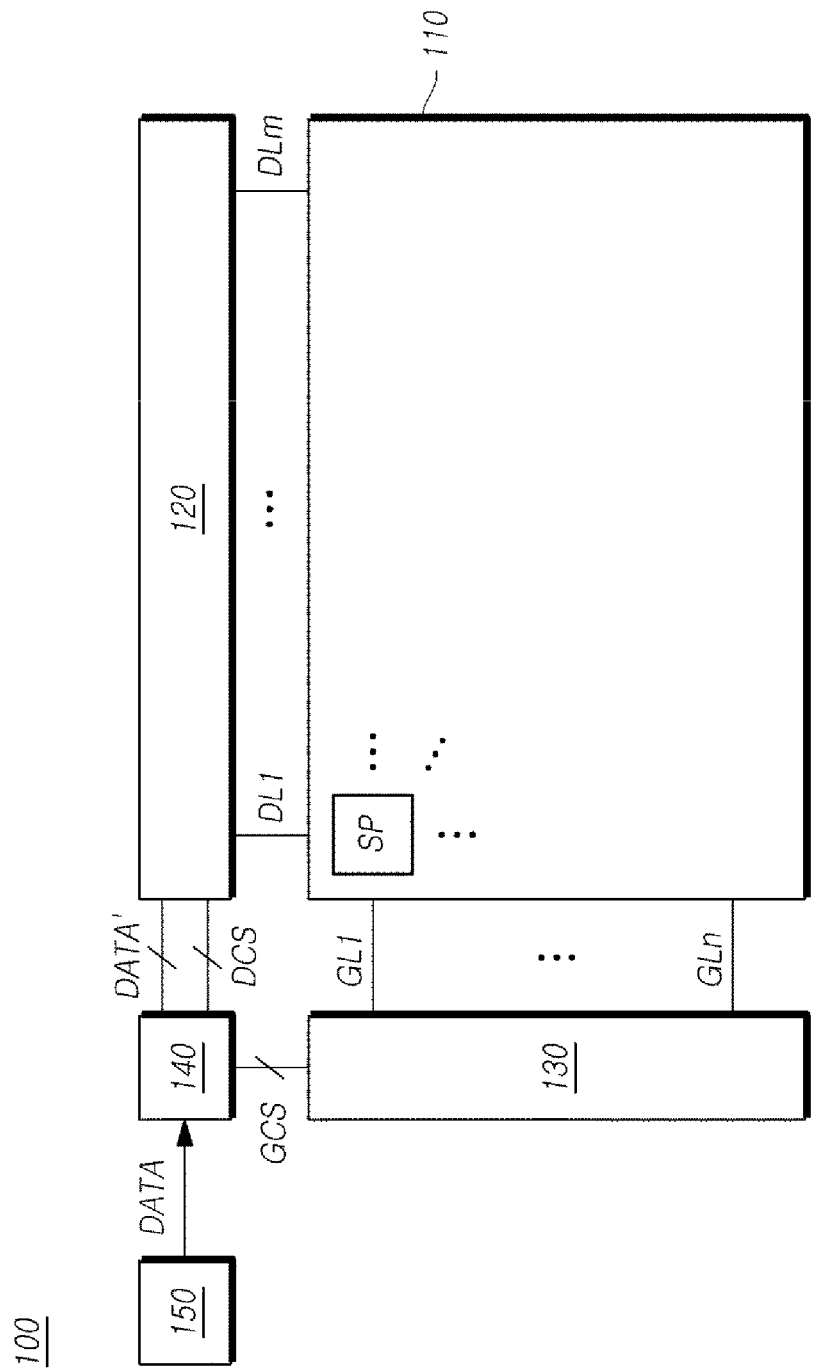
FIG. 1 illustrates a system configuration of an organic light emitting display device 100 according to embodiments of the present invention.

Hereinafter, exemplary embodiments of the present invention will be described with reference to the accompanying drawings. In the following description, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 illustrates a system configuration of an organic light emitting display device 100 according to embodiments of the present invention.

Referring to FIG. 1, the organic light emitting display device 100, according to the present embodiments, may include an organic light emitting display panel 110, a data driving unit 120, a gate driving unit 130, and a timing controller 140.

The organic light emitting display panel 110 may include a plurality of data lines DL1 to DLm (m is a natural number equal to or more than 2) arranged in a first direction, a plurality of gate lines GL1 to GLn (n is a natural number equal to or more than 2) arranged in a second direction that cross with the first direction, and a plurality of sub-pixels (SP) in a matrix.

The data driving unit 120 may supply a data voltage to the plurality of data lines DL1 to DLm to drive the same.

The gate driving unit 130 may supply scan signals in sequence to the plurality of gate lines GL1 to GLn to drive the same.

The timing controller 140 may supply control signals to the data driving unit 120 and the gate driving unit 130 to control the operations thereof.

The timing controller 140 may start scanning according to a timing implemented in each frame, and may convert image data (Data) input from a host system 150 into data signal suitable for the data driving unit 120 to output the converted image data (Data'). In addition, the timing controller 140 may control the driving of data at proper time according to the scanning.

The gate driving unit 130 may supply voltage-on signals or voltage-off signals to the plurality of gate lines GL1 to GLn to thereby drive the same in sequence, under the control of the timing controller 140.

The gate driving unit 130 may be provided on one side of the organic light emitting display panel 110 as shown in FIG. 1, or may be on both sides thereof in some cases, according to a driving type.

In addition, the gate driving unit 130 may include a plurality of gate driver integrated circuits (ICs). The plurality of gate driver ICs may be connected to a bonding pad of the organic light emitting display panel 110 in a tape automated bonding (TAB) type or a chip-on-glass (COG) type, or may be directly mounted on the organic light emitting display panel 110 in a gate-in-panel (GIP) type. Alternatively, the gate driver ICs may be integrated on the organic light emitting display panel 110, in some cases.

The plurality of gate driver ICs set forth above may include a shift resistor, a level shifter, or the like.

When a specific gate line is opened, the data driving unit 120 may convert the image data (Data') received from the timing controller 140 into an analog data voltage (Vdata) to be thereby supplied to the plurality of data lines DL1 to DLm for driving the data lines DL1 to DLm.

The data driving unit 120 may include a plurality of source driver integrated circuits (ICs, referred to as a "data driver IC" as well). The plurality of source driver ICs may be connected to a bonding pad of the organic light emitting display panel 110 in a tape automated bonding (TAB) type or a chip-on-glass (COG) type, or may be directly mounted on the organic light emitting display panel 110. Alternatively, the source driver ICs may be integrated on the organic light emitting display panel 110, in some cases.

The plurality of source driver ICs set forth above may include a shift resistor, a latch, a digital analog converter (DAC), an output buffer, or the like, and in some cases, may further include an analog digital converter (ADC) that converts a sensed analog voltage value into a digital value to thereby output the sensed data for sub-pixel compensation (brightness difference compensation, or data compensation).

The plurality of source driver ICs may be implemented, for example, in a chip-on-film (COF) type. One end of each of the plurality of source driver ICs may be bonded with at least one source printed circuit board (S-PCB), and the other end thereof may be bonded with the bonding pad of the organic light emitting display panel 110.

Meanwhile, the host system 150 mentioned above may transmit various timing signals, such as vertical synchronization signals (Vsync), horizontal synchronization signals (Hsync), input data enable (DE) signals, or clock signals (CLK), together with the image data (Data) of an input image, to the timing controller 140.

The timing controller 140 may convert the image data (Data) received from the host system 150 into data signals suitable for the data driving unit 120 to thereby output the converted image data (Data'). In addition, the timing controller 140 may receive the timing signals, such as the vertical synchronization signal (Vsync), the horizontal synchronization signal (Hsync), the input DE signal, or the clock signal, and may create various control signals to be thereby transmitted to the data driving unit 120 and the gate driving unit 130 for controlling the same.

For example, in order to control the gate driving unit 130, the timing controller 140 may output gate control signals (GCS) including a gate start pulse (GSP) signal, a gate shift clock (GSC) signal, a gate output enable (GOE) signal, or the like.

The GSP signal may control an operation start timing of the gate driver IC constituting the gate driving unit 130. The GSC signal is a clock signal that is input to the gate driver ICs in common, and it may control a shift timing of a scan signal (a gate pulse). The GOE signal may indicate timing information of the gate driver ICs.

In order to control the data driving unit 120, the timing controller 140 may output data control signals (DCS) including a source start pulse (SSP) signal, a source sampling clock (SSC) signal, a source output enable (SOE) signal, or the like.

The SSP signal may control a data sampling start timing of the source driver ICs constituting the data driving unit 120. The SSC signal is a clock signal that controls a data sampling timing in the source driver ICs. The SOE signal may control an output timing of the data driving unit 120. In some cases, the DCS may further include a polarity control signal (POL) in order to control the polarity of the data voltage of the data driving unit 120. In the case where the image data (Data') input to the data driving unit 120 is transmitted according to the interface standard of mini low voltage differential signaling (LVDS), the SSP and the SSC may be omitted.

Referring to FIG. 1, the organic light emitting display device 100 may further include a power controller (not shown) that supplies voltages and currents to the organic light emitting display panel 110, the data driving unit 120, and the gate driving unit 130, or controls the voltages and currents. The power controller may be referred to as a power management IC (PMIC).

Figure 2:
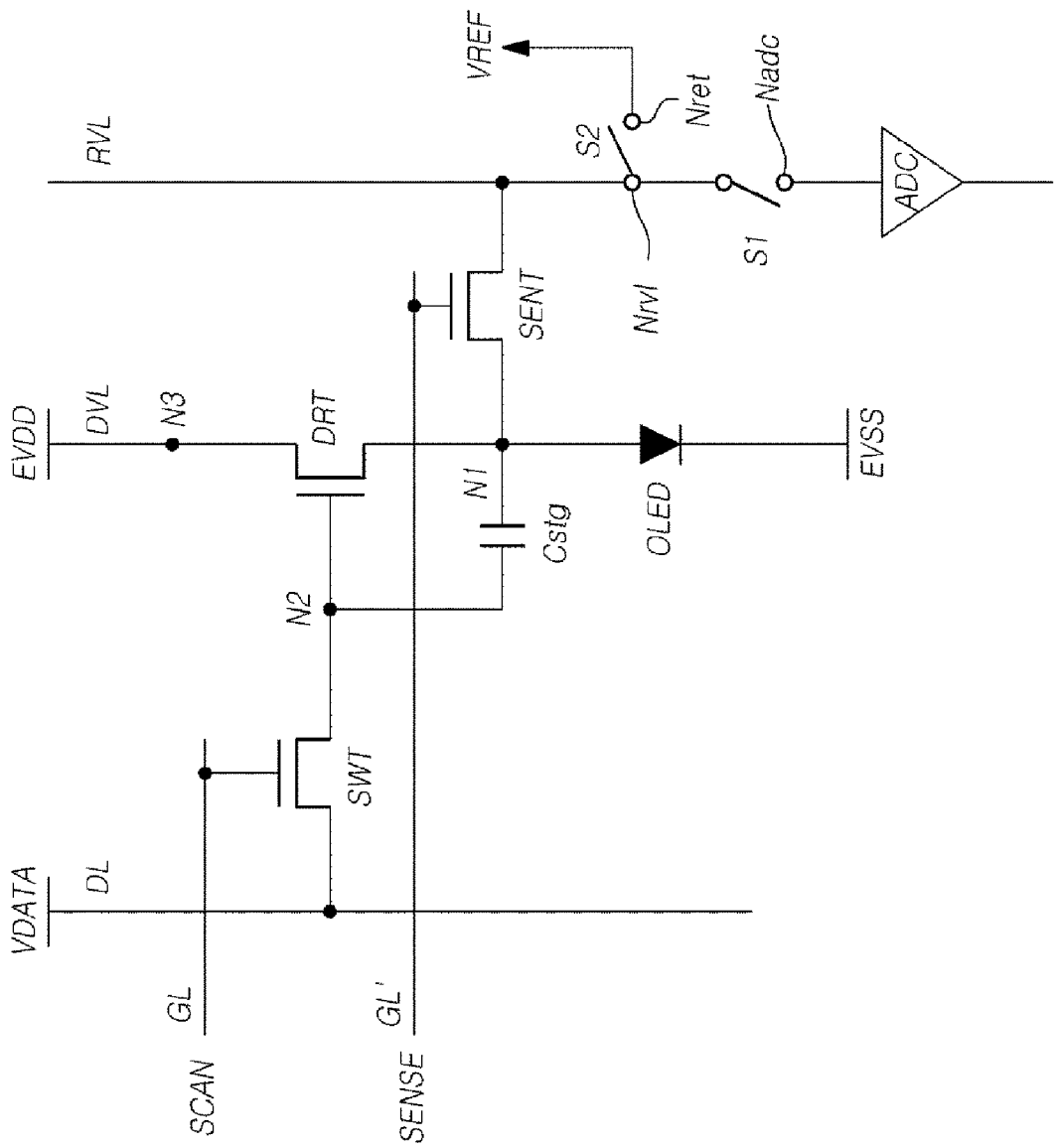
FIG. 2 illustrates an equivalent circuit diagram of a sub-pixel (SP) adopting a sensing structure of a driving transistor (DRT) in an organic light emitting display device 100 according to embodiments of the present invention.

FIG. 2 illustrates an equivalent circuit diagram of a sub-pixel (SP) adopting a sensing structure of a driving transistor (DRT) in an organic light emitting display device 100 according to embodiments of the present invention.

Referring to FIG. 2, basically, the driving transistor (DRT) for driving the OLED is disposed in each sub-pixel (SP) of the organic light emitting display panel 110.

The driving transistor (DRT) has characteristic parameters, such as a threshold voltage, the mobility, or the like.

As the driving time increases, the driving transistor (DRT) tends to be degraded so that the characteristic parameters may be changed.

Since the degree of degradation of the driving transistors (DRT) between sub-pixels may be different from each other, there may be a difference in the characteristic parameters (the threshold voltage, and the mobility) between the driving transistors (DRT) of the sub-pixels.

This may bring about a difference in the brightness between the sub-pixels, which may cause deterioration of the picture quality.

Accordingly, in order to compensate the difference in the brightness between the sub-pixels, that is, in order to compensate the difference in the characteristic parameters between the driving transistors (DRT), it is required to sense the characteristic parameters of the driving transistors (DRT). Hereinafter, the sensing of the characteristic parameters of the driving transistor (DRT) will be referred to as "sensing of the driving transistor (DRT)."

Therefore, each sub-pixel of the organic light emitting display panel 110, according to the present embodiments, may further include a transistor {hereinafter, referred to as a sensing transistor (SENT)} that is used for the sensing of the driving transistor (DRT).

Referring to FIG. 2, more specifically, the sub-pixel (SP) having a sensing structure of the driving transistor (DRT) may include an organic light emitting diode (OLED), a driving transistor (DRT), a switching transistor (SWT), a storage capacitor (Cstg), a sensing transistor (SENT), or the like.

The driving transistor (DRT) may supply a driving current to the organic light emitting diode (OLED) to drive the same, and may have the first node (hereinafter, referred to as a "N1 node") that is electrically connected with the first electrode (e.g., an anode, or a cathode) of the organic light emitting diode (OLED), the second node (hereinafter, referred to as a "N2 node") corresponding to a gate node, and the third node (hereinafter, referred to as a "N3 node") that is electrically connected with a driving voltage line (DVL).

The switching transistor (SWT) may be controlled by a scan signal applied to the gate node through a corresponding gate line (GL), and may be electrically connected between the N2 node of the driving transistor (DRT) and the data line (DL).

The storage capacitor (Cstg) may be electrically connected between the N1 node and the N2 node of the driving transistor (DRT), and may maintain a constant voltage for one frame.

The first sensing transistor (SENT) may be controlled by the first sensing signal (SENSE), which is one of the scan signals applied to the gate node through a corresponding gate line (GL'), and may be electrically connected between the N1 node of the driving transistor (DRT) and a reference voltage line (RVL).

Referring to FIG. 2, the organic light emitting display device 100, according to the present embodiments, may further include an analog digital converter (ADC), as an entity for sensing the characteristic parameters of the driving transistor (DRT), which senses a voltage of the N1 node of the driving transistor (DRT) through the reference voltage line (RVL).

Here, the analog digital converter (ADC) may be included in the source driver IC.

Referring to FIG. 2, the organic light emitting display device 100, according to the present embodiments, may further include switches S1 and S2 that connect a node (Nrvl), which is connected with the reference voltage line (RVL), to a node (Nadc), which is connected with the analog digital converter (ADC), or a supply node (Nref) of the reference voltage (Vref).

The structure of FIG. 2 may be applied to each of pixels of RGB colors. That is, the OLED of FIG. 2 is a circuit for controlling one of a blue pixel, a red pixel, or a green pixel.

As shown in FIG. 2, a single circuit controls a single pixel for a single color. The pixels emit lights of specific colors, such as R, G, B, or white (W).

The organic light emitting display panel 110 has a plurality of pixels of FIG. 2, and each pixel is applied with a driving voltage (VDD or EVDD). It is required to interrupt the over-current of the driving voltage in order to prevent the display panel 110 and the components thereof from being damaged by the over-current.

In the typical organic light emitting display device, the current flowing through the display panel varies with input images. A small current flows through the display panel in the case of a dark image, whereas a large current flows through the display panel in the case of a white or bright image. Therefore, in the case of an image that has many white patterns, the excessive current may flow through the display panel to increase power consumption. In order to address the problem of power consumption, an automatic current limiting (ACL) algorithm, which controls the current flowing through the display panel according to an input image of one frame, may be applied to limit the EVDD current through the display panel 110, but this may bring about degradation of the brightness of the display panel.

Figure 3:
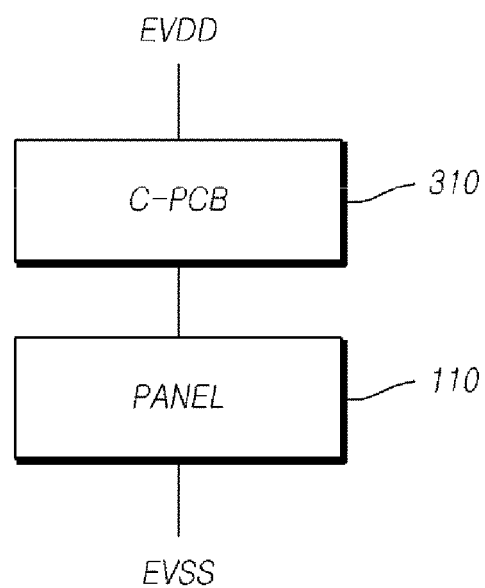
FIG. 3 illustrates a configuration of controlling the over-current by applying an automatic current limiting algorithm.

FIG. 3 illustrates a configuration of controlling the over-current by applying the automatic current limiting algorithm. In FIG. 2, the EVDD and the EVSS are connected with each pixel, and are extended to the outside of the panel as shown in FIG. 3. The EVDD voltage may be applied to the display panel 110 via a control PCB (C-PCB) 310 from the external host system (set) 150. In addition, the EVSS is connected to the outside of the display panel 110 as well.

The ACL algorithm set forth above may estimate a consumption current of the display panel 110 to obtain a gain with respect to a target current. More specifically, the ACL algorithm may calculate a total consumption current by estimating the current in each pixel, and may calculate a limiting gain from the calculated current and the target current to thereby implement the same by interworking with a peak brightness control block. Accordingly, the ACL algorithm can reduce the power consumption by limiting the peak luminance of the display panel according to the brightness of the input image, and can prevent the over-current by lowering the overall brightness when the excessive current more than a limit current is expected to flow according to a specific pattern. However, although the ACL algorithm can limit the current, the value calculated according to the ACL algorithm is not accurate, and no hardware for protecting the display panel from the over-current of the EVDD is provided. That is, in the ACL algorithm, the limit is determined by a data voltage when a configured current flows, and the current of the EVDD is not monitored directly to limit the same. Therefore, since the accurate current cannot be detected, it is more likely to fail to control the over-current.

Accordingly, the embodiment of the present invention provides a structure that prevents the inflow of the over-current through the EVDD line by adopting a simple circuit. More specifically, the embodiment of the present invention provides an over-current controller that prevents the inflow of the over-current through the EVDD line using a PMOS or NMOS and an OP-Amp. The over-current controller of the present invention may be included in the control PCB set forth above, or may be separated from the control PCB. According to another embodiment of the present invention, the over-current controller is formed between the pixel and the EVDD line to interrupt the over-current to the pixel of the display panel 110.

Figure 4:
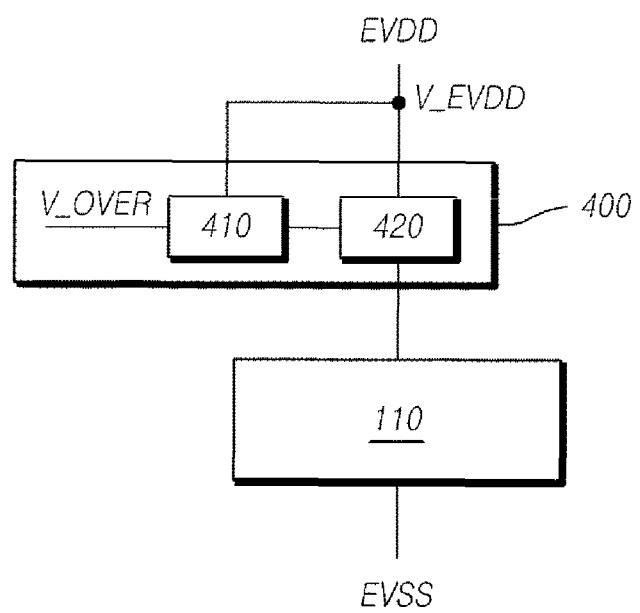
FIG. 4 illustrates a configuration of an over-current controller according to an embodiment of the present invention.

FIG. 4 illustrates a configuration of the over-current controller according to an embodiment of the present invention.

The over-current controller 400 may identify the over-current through a degree of a voltage drop through the EVDD line. More specifically, an over-current identification unit 410 may compare a voltage (V_evdd) of the EVDD line with a reference voltage (V_over) for identifying the over-current. If the voltage (V_evdd) of the EVDD line reaches or becomes lower than the reference voltage (V_over) corresponding to the over-current, the over-current identification unit 410 may recognize that the over-current flows through the EVDD line so the interruption unit 420 may interrupt the power through the EVDD line. That is, the over-current identification unit 410 may take the driving voltage supply line as the first input port and the reference voltage line as the second input port. Here, the reference voltage may be equal to, or greater than the voltage of the driving voltage supply line, which has dropped when the over-current flows to the display panel. In case of no over-current, the reference voltage may be configured to be less than the driving voltage on the supply line to make it easy to determine whether the voltage of the driving voltage supply line is within the range of the over-current. This enables the voltage drop of the driving voltage supply line due to the over-current to be easily determined, and provides a simple configuration and an accurate operation using circuits such as an OP-Amp that will be described later.

The reference voltage (V_over) of the over-current identification unit 410 may be configured as various values. For example, when the reference voltage (V_evdd) drops due to the over-current, the voltage of an allowable value may be applied as the V_over for comparison.

To make a summary of FIG. 4, the over-current identification unit 410 may identify a voltage drop of the driving voltage supply line, which applies the driving voltage to the driving transistor among thin film transistors for controlling the pixels of the display panel, and if it is determined that the over-current flows to the display panel 110, the interruption unit 420 interrupts the current of the driving voltage supply line to the display panel 110. That is, the over-current inside the display panel can be determined from the outside of the display panel to thereby lower the possibility of generating an over-current, so the over-current generated through the driving voltage supply line can be controlled in a manner of hardware. Therefore, the display panel may be prevented from deteriorating due to the over-current. In addition, the over-current controller 400 provided outside the display panel 110 as shown in FIG. 4 can be manufactured separately from the display panel 110 to be then combined to the same, and the over-current controller 400 is not affected by the malfunction of the display panel 110 due to the over-current to thereby maintain the normal operation thereof.

Figure 5:
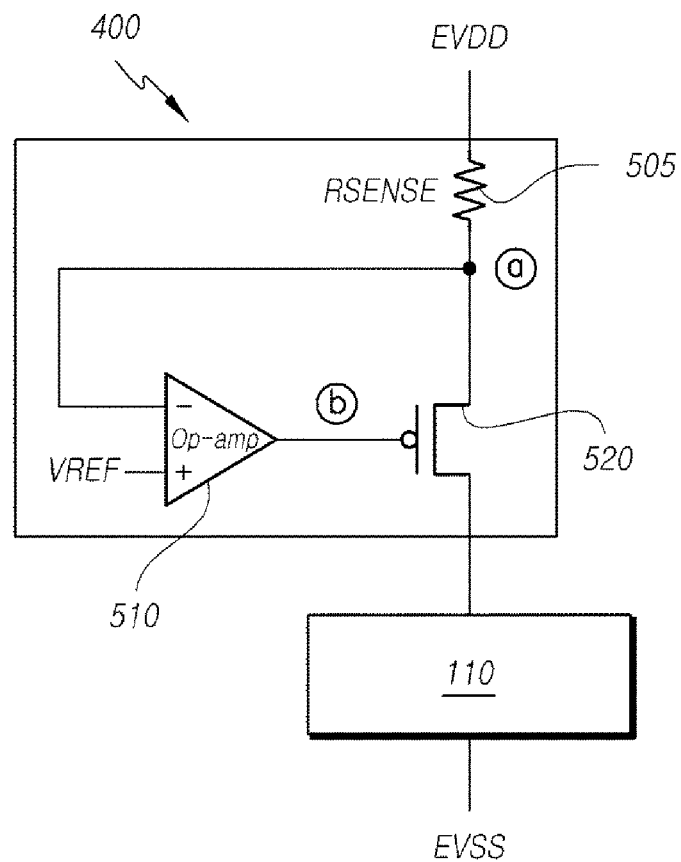
FIG. 5 illustrates a detailed configuration of an over-current controller according to an embodiment of the present invention.

FIG. 5 illustrates a detailed configuration of the over-current controller 400 according to an embodiment of the present invention. Here, the over-current identification unit is configured as an OP-Amp 510, and the interruption unit is configured as a PMOS 520. A resistor (Rsense) 505 may be connected between the EVDD and a source terminal of the PMOS 520. The "−" terminal of the OP-Amp 510 may be applied with the EVDD, and may be connected with the terminal "a" of the resistor (Rsense) 505. The "+" terminal of the OP-Amp 510 is applied with the reference voltage, i.e., Vref in FIG. 5, for identifying the over-current. The reference voltage (Vref) is the voltage that is applied to the sensing transistor among the thin film transistors of the pixels. Since the EVDD over-current is identified using the voltage, such as the reference voltage (Vref), applied to the display panel without applying a separate voltage as a reference voltage to the over-current identification unit, the configuration of the circuit can be simplified. The OP-Amp 510, as the over-current identification unit, may compare the voltage of the terminal "a" of the resistor (Rsense) with the reference voltage (Vref). As a result of the comparison, when the voltage of the terminal "a" of the resistor (Rsense) drops below the reference voltage (Vref) due to the over-current, the voltage of the terminal "b" increases. As a result, VSG of the PMOS 520, as the interruption unit, is reduced to thereby turn off the PMOS 520. In the case of the over-current through the EVDD line, the PMOS 520 may interrupt the over-current so that the EVDD is no longer applied to the panel 110.

Equation 1 shows the relationship between the current and the voltage, which are applied to the PMOS 520.

$$I_{ds} = \frac{\beta_n}{2}(V_{SG} - |V_{th}|)^2(1 + \lambda V_{SD})$$ Equation 1

Here, the current, which flows between the drain and the source of the PMOS 520, may be calculated using the voltage (Vsg) applied to the gate, the threshold voltage (Vth) of the PMOS, and the voltage between the source and the drain of the PMOS.

$$I_o \uparrow \rightarrow V_a \downarrow \rightarrow V_b \uparrow \uparrow \rightarrow V_{SG} \downarrow \downarrow$$ Equation 2

When the current (Io) of the resistor (Rsense) increases, according to Equation 2 above, the voltage (Va) of the terminal "a" drops, and the voltage (Vb) of the terminal "b" increases. As a result, the voltage (Vsg) of the PMOS 520 is reduced to thereby turn off the PMOS 520. Consequently, the current from the EVDD may be interrupted.

Although the Vref is applied as the reference voltage in FIG. 5, the present invention is not limited thereto, and a voltage lower than the voltage (EVDD) when no over-current flows may be applied to the "+" terminal.

The configuration of FIG. 5 can be summarized as follows. The interruption unit is configured as the PMOS 520, and the over-current identification unit is configured as the OP-Amp 510. One end of the sensing resistor 505 is connected with the driving voltage power line, and the other end thereof is connected with the source of the PMOS 520 as the interruption unit. In addition, the "−" terminal of the OP-Amp is connected with the other end of the sensing resistor 505, and the "+" terminal of the OP-Amp is applied with the reference voltage. Furthermore, the output terminal of the OP-Amp is connected with the gate node of the PMOS.

Figure 6:
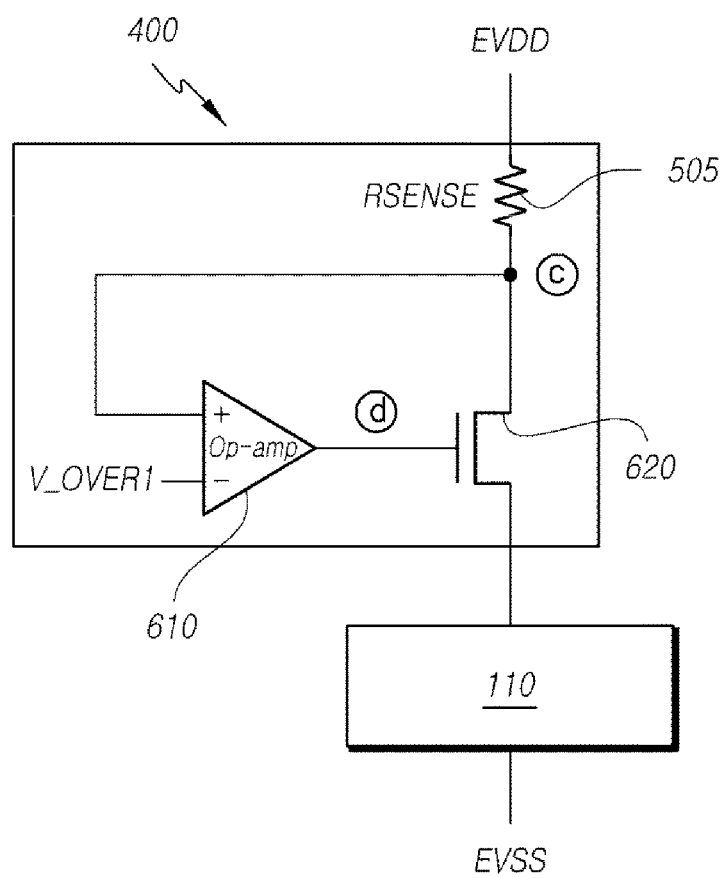
FIG. 6 illustrates a detailed configuration of an over-current controller according to another embodiment of the present invention.

FIG. 6 illustrates a detailed configuration of the over-current controller 400 according to another embodiment of the present invention. The embodiment of FIG. 6 adopts the NMOS instead of the PMOS of FIG. 5. In addition, the OP-Amp 610 may be used as the over-current identification unit as well, but it may be different from that of FIG. 5 in the connection thereof with the terminals.

FIG. 6 shows that the over-current identification unit is configured as an OP-Amp 610, and the interruption unit is configured as a NMOS 620. The resistor (Rsense) 505 may be connected between the EVDD and the drain terminal of the NMOS 620. The "+" terminal of the OP-Amp 610 may be applied with the EVDD, and may be connected with the terminal "c" of the resistor (Rsense) 505. The "−" terminal of the OP-Amp 610 is applied with the reference voltage, i.e., V_over1 in FIG. 6, for identifying the over-current. As a result, the OP-Amp 610, as the over-current identification unit, may compare the voltage of the terminal "c" of the resistor (Rsense) 505 with the reference voltage (V_over1). As a result of the comparison, when the voltage (Vc) of the terminal "c" of the resistor (Rsense) drops below the reference voltage (V_over1) due to the over-current, the voltage (Vd) of the terminal "d" drops. As a result, VSG of the NMOS 620, as the interruption unit, is reduced to thereby turn off the NMOS 620 so that the current of the EVDD is no longer applied to the panel 110. The reference voltage (V_over1) may be configured to be lower than the voltage of the EVDD when no over-current flows.

The configuration of FIG. 6 can be summarized as follows. The interruption unit is configured as the NMOS 620, and the over-current identification unit is configured as the OP-Amp 610. One end of the sensing resistor 505 is connected with the driving voltage supply line, and the other end thereof is connected with the drain of the NMOS 620 as the interruption unit. In addition, the "+" terminal of the OP-Amp is connected with the other end of the sensing resistor 505, and the "−" terminal of the OP-Amp is applied with the reference voltage. Furthermore, the output terminal of the OP-Amp is connected with the gate node of the NMOS.

In FIGS. 5 and 6, when the voltage drops below a specific voltage due to the over-current, the current of the EVDD to the panel is interrupted to prevent the inflow of the over-current.

In FIGS. 5 and 6, the voltage applied to the panel is compared with a specific voltage to identify the over-current, and the EVDD is controlled to be applied to the panel according to the comparison result.

Figure 7A:
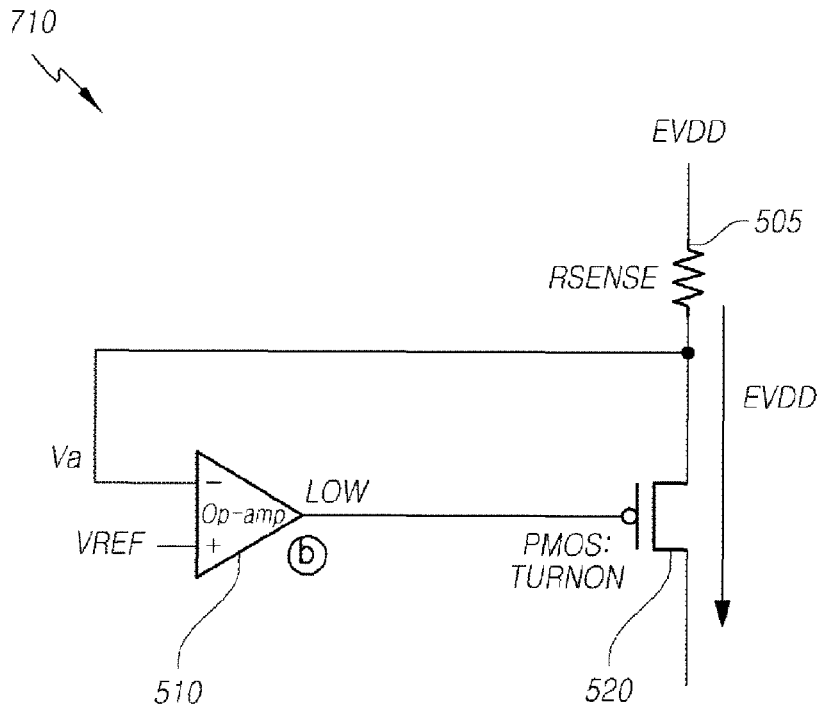
FIGS. 7(a) and 7(b) illustrate the operation of interrupting the over-current in the configuration of FIG. 5 according to an embodiment of the present invention.
Figure 7B:
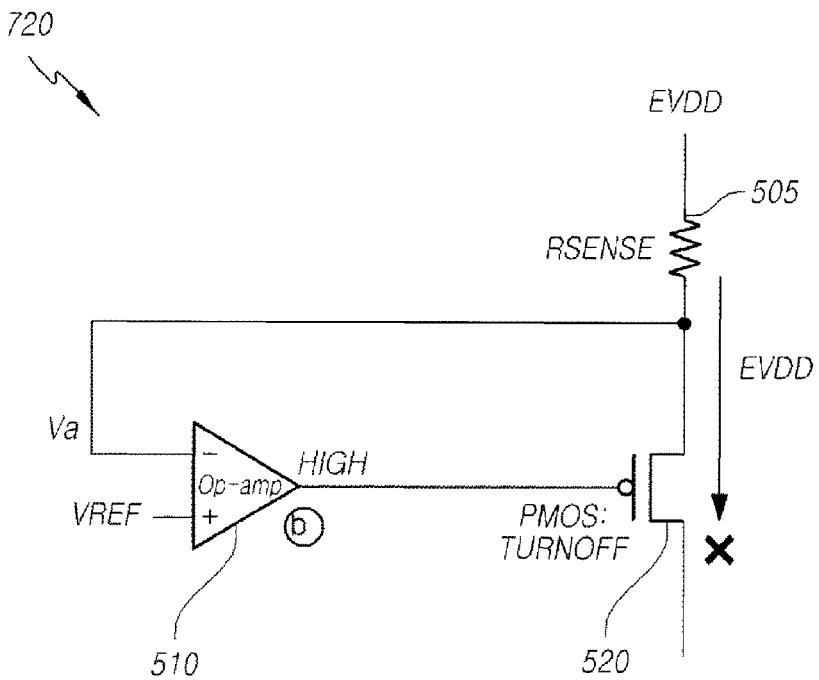

FIGS. 7(a) and 7(b) illustrates the operation of interrupting the over-current in the configuration of FIG. 5 according to an embodiment of the present invention. The description will be made of the OP-Amp 510 as the over-current identification unit, and the PMOS 520 as the interruption unit of FIG. 5. In diagrams 710 and 720 of FIGS. 7(a) and 7(b) respectively, the voltage (Va) of the terminal "a" and the reference voltage (Vref) of FIG. 5 are applied to the OP-Amp 510. The voltage (Vref) is an example of the reference voltage (V_over) for determining the over-current in FIGS. 7(a) and 7(b), but a specific voltage, which is lower than the EVDD, may be applied as the reference voltage for identifying the over-current. Diagram 710 in FIG. 7(a) shows the case of Va>Vref. A "Low" value is output from the terminal "b" of the OP-Amp 510. As a result, the PMOS 520 is turned on, and the EVDD is applied to the panel through the PMOS 520. On the contrary, diagram 720 in FIG. 7(b) shows the case of Va<Vref. A "High" value is output from the terminal "b" of the OP-Amp 510. As a result, the PMOS 520 is turned off, and the EVDD is no longer applied to the panel.

Referring to FIGS. 5 and 7(a) and 7(b), one end of the sensing resistor 505 is connected with the driving voltage supply line EVDD, and the other end of the sensing resistor is connected with the source of the PMOS 520 operating as the interruption unit. In addition, the OP-Amp 510 is used as the over-current identification unit, and the "−" terminal of the OP-Amp is connected with the other end of the sensing resistor 505. Furthermore, the "+" terminal of the OP-Amp is supplied with the reference voltage to thereby identify the over-current. The output terminal of the OP-Amp is connected with the gate node of the PMOS as the interruption unit so that the PMOS may be turned off in the case of the over-current as shown in FIG. 7(b). The over-current of the EVDD can be prevented from flowing to the display panel by a combination of the OP-Amp and the PMOS.

Figure 8A:
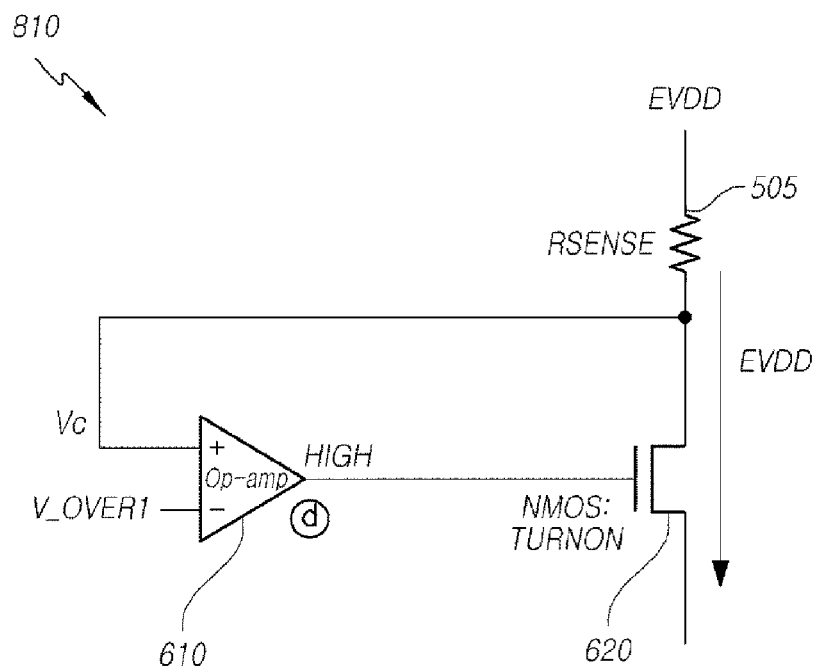
FIGS. 8(a) and 8(b) illustrate the operation of interrupting the over-current in the configuration of FIG. 6 according to another embodiment of the present invention.
Figure 8B:
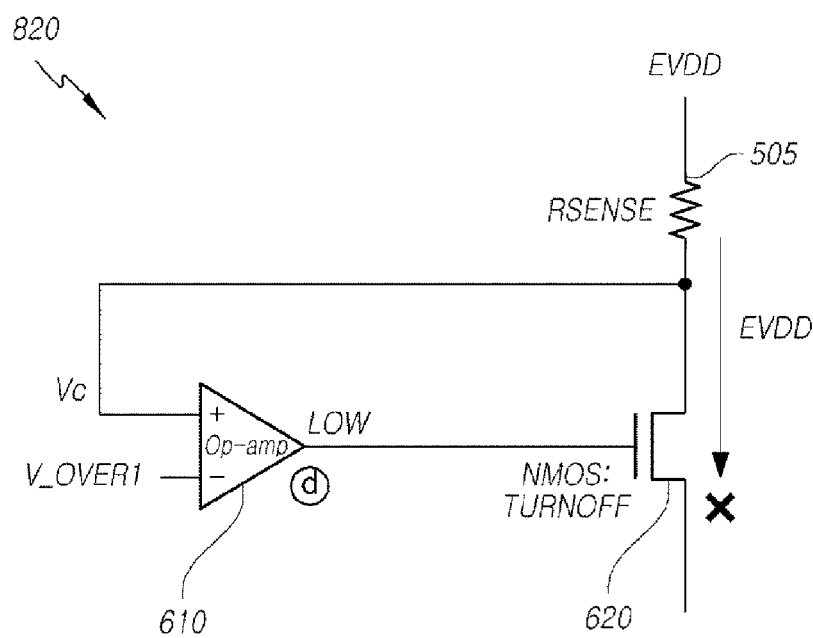

FIGS. 8(a) and 8(b) illustrate the operation of interrupting the over-current in the configuration of FIG. 6 according to another embodiment of the present invention. The description will be made of the OP-Amp 610 as the over-current identification unit, and the NMOS 620 as the interruption unit of FIG. 6. In diagrams 810 and 820 of FIGS. 8(a) and 8(b), the voltage (Vc) of the terminal "c" and the reference voltage (V_over1) of FIG. 6 are applied to the OP-Amp 610. The voltage (V_over1) is the reference voltage for determining the over-current, and it may be selected from among various voltage values. Diagram 810 of FIG. 8(b) shows the case of Vc>V_over1. A "High" value is output from the terminal "d" of the OP-Amp 610. As a result, the NMOS 620 is turned on, and the EVDD is applied to the panel through the NMOS 620. On the contrary, diagram 820 of FIG. 8(b) shows the case of Vc<V_over1. A "Low" value is output from the terminal "d" of the OP-Amp 610. As a result, the NMOS 620 is turned off, and the EVDD is no longer applied to the panel.

Referring to FIGS. 6, 8(a) and 8(b), one end of the sensing resistor 505 is connected with the driving voltage supply line EVDD, and the other end of the sensing resistor 505 is connected with the source of the NMOS 620 operating as the interruption unit. In addition, the OP-Amp 610 is used as the over-current identification unit. On the contrary to the configuration of FIGS. 5, 7(a) and 7(b), the "+" terminal of the OP-Amp is connected with the other end of the sensing resistor 505, and the "−" terminal of the OP-Amp is applied with the reference voltage to thereby identify the over-current. The output terminal of the OP-Amp is connected with the gate node of the NMOS as the interruption unit so that the NMOS may be turned off in the case of the over-current as shown in FIGS. 8(a) and 8(b). The over-current of the EVDD can be prevented from flowing to the display panel by a combination of the OP-Amp and the NMOS.

Figure 9:
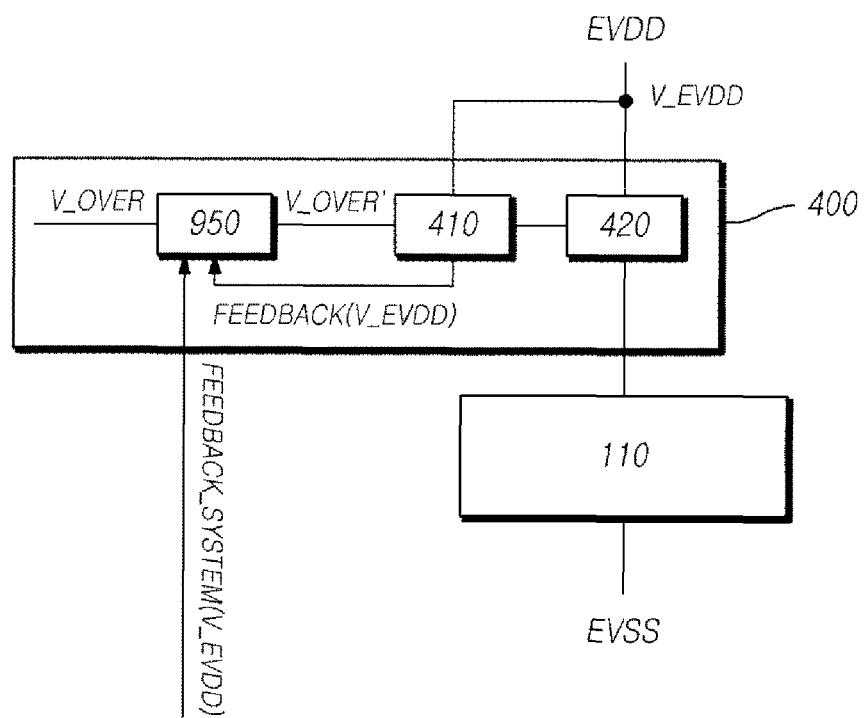
FIG. 9 illustrates a configuration including a reference voltage increasing/decreasing unit for increasing and decreasing a reference voltage according to an embodiment of the present invention.

FIG. 9 illustrates a configuration including a reference voltage increasing/decreasing unit for increasing and decreasing the reference voltage according to an embodiment of the present invention. As described above, the reference voltage (V_over), which may be allocated with the Vref or another configured voltage, may be a reference value to identify whether or not the voltage of the driving voltage supply line corresponds to the over-current. The reference voltage may be a fixed value, or may be increased or decreased according to the frequency or features of the generation of the over-current. FIG. 9 shows the embodiment of the over-current controller 400 that further includes a reference voltage increasing/decreasing unit 950. The reference voltage increasing/decreasing unit 950 may apply the reference voltage (V_over) applied from the outside directly to the over-current identification unit 410. Meanwhile, the over-current identification unit 410 may feed the voltage value (V_evdd) applied to the driving voltage supply line back to the reference voltage increasing/decreasing unit 950, and the reference voltage increasing/decreasing unit 950 may increase or decrease the voltage (V_over'), which is to be applied to the over-current identification unit 410, with reference to the fed value.

As to an example of decreasing the voltage (V_over'), when the V_evdd decreases temporarily, it may be determined as the over-current even though it is not the over-current. In this case, the reference voltage increasing/decreasing unit 950 may reduce the voltage (V_over') to lower the reference value for identifying the over-current. As to an example of increasing the voltage (V_over'), when the V_evdd increases temporarily, it may not be determined as the over-current even though it is the over-current. In this case, the reference voltage increasing/decreasing unit 950 may increase the voltage (V_over') to raise the reference value for identifying the over-current.

Furthermore, the reference voltage increasing/decreasing unit 950 may increase or decrease the reference voltage according to the over-current identified in the display panel or the system. For example, even though the over-current identification unit 410 is not able to identify the over-current, when the over-current is identified through a separate feedback signal, the reference voltage increasing/decreasing unit 950 may increase the reference voltage to detect the over-current more accurately. Therefore, the reference voltage increasing/decreasing unit 950 may receive a signal indicating the generation of the over-current from the outside of the over-current controller 400 in order to determine the increase and the decrease in the reference voltage.

An embodiment of the present invention, in the operation of the display device, such as OLED TV sets, may prevent the over-current of the EVDD voltage from flowing to the panel of the display device to thereby attenuate the damage to the components and the panel. The EVDD current to the panel has been controlled through the ACL algorithm in the prior art, but it is not likely to detect the over-current accurately because it does not directly monitor the current.

On the contrary, according to the present invention, the over-current identification unit and the over-current interruption unit can be configured as simple hardware. In an embodiment, the current may be directly monitored in order to interrupt the EVDD over-current flowing to the panel and the components using the OP-Amp and the PMOS (or NMOS). In addition, in the case of the over-current, the PMOS or the NMOS may be promptly turned off to minimize the damage to the device.

A control device, according to an embodiment of the present invention, may be combined to the C-PCB as shown in FIG. 3. The control device may include the over-current identification unit and the over-current controller, as set forth above. A single OP-Amp and the PMOS or the NMOS may be connected to the driving voltage supply line. The OP-Amp may provide a function of identifying the over-current, and the PMOS or the NMOS may provide a function of interrupting the over-current. More specifically, a control device including the over-current controller 400 shown in FIGS. 4 to 9 may be combined to the C-PCB. The over-current identification unit, such as the OP-Amp, may identify a voltage drop of the driving voltage supply line for applying the driving voltage to the driving transistor among the thin film transistors for controlling the pixels of the display device to thereby recognize the over-current to the display panel, and the interruption unit, such as the NMOS or the PMOS, may interrupt the voltage of the driving voltage supply line when the over-current is identified by the over-current identification unit. The OP-Amp may receive the voltage of the driving voltage supply line and the reference voltage to thereby identify the over-current, and the sensing resistor may be interposed between the OP-Amp and the driving voltage supply line. The voltage (Vref) provided to the sensing transistor of the pixel may be an example of the reference voltage. In addition, the over-current interruption unit may be configured as the PMOS or the NMOS, and the type of signal input to the input terminal of the over-current identification unit has been described in FIGS. 5 to 8 above. In addition, as set forth in FIG. 9, the over-current controller may further comprise the reference voltage increasing/decreasing unit that increases or decreases the reference voltage according to the increase and the decrease in the over-current to thereby control the monitoring of the over-current of the driving voltage and the interruption of the over-current more accurately.

As shown in the embodiment of the present invention, the PMOS (or the NMOS), the OP-Amp, and the sensing resistor (Rsense) may be provided on the path of the EVDD inside the C-PCB in order to interrupt the over-current. Here, the sensing resistor may be connected between the driving voltage supply line (the EVDD line) and the source terminal of the PMOS (or the NMOS).

In the case where the over-current of the driving voltage supply line is interrupted by the PMOS, an inverting terminal of the OP-Amp is connected to the source terminal of the PMOS, and a non-inverting terminal of the OP-Amp is connected to the voltage (Vref) line for configuration. In addition, the output terminal of the OP-Amp is connected with the gate terminal of the PMOS.

In the case where the over-current of the driving voltage supply line is interrupted by the NMOS, an inverting terminal of the OP-Amp may be connected with the voltage (Vref) line. A non-inverting terminal of the OP-Amp is connected to the source terminal of the NMOS. In addition, the output terminal of the OP-Amp is connected with the gate terminal of the NMOS.

As describe above, the embodiment of the present invention provides a configuration that interrupts the EVDD applied to the OLED in the case of the over-current in order to detect the over-current and prevent damage to the panel. The embodiment of the present invention may be operated in cooperation with a conventional system or elements for detecting the over-current.

The description and the attached drawings are provided only to exemplary describe the technical the present invention, and it will be appreciated by those skilled in the art to which the present invention pertains that the present invention may be variously corrected and modified, for example, by coupling, separating, replacing, and changing the elements. Accordingly, the embodiments disclosed in the present invention are merely to not limit but describe the technical idea of the present invention. Further, the scope of the present invention is not limited by the embodiments. The scope of the present invention shall be construed on the basis of the accompanying claims in such a manner that all of the technical ideas included within the scope equivalent to the claims belong to the present invention.

What is claimed:

1. An over-current control device for detecting an over-current provided to an organic light emitting device (OLED), comprising:
   an over-current identification unit configured to compare a driving voltage on a supply line for driving the OLED with a reference voltage on a reference voltage line for identifying the over-current;
   an interruption unit connected between the supply line supplying the driving voltage and the OLED for interrupting the power supply when the over-current identification unit recognizes an over-current flowing through the supply line;
   a reference voltage increasing/decreasing unit for increasing or decreasing the reference voltage which is feedback to the driving voltage on a supply line; and
   a resistor directly connected between the supply line carrying the driving voltage and the interruption unit;
   wherein the interruption unit is directly connected between the resistor and the OLED.

2. The over-current control device according to claim 1, further comprising:
   a comparator having a first and second input and an output, wherein the first input is connected to a node between the resistor and the interruption unit, and the second input is connected to the reference voltage line, and wherein the output of the comparator is connected with an input of the interruption unit.

3. The over-current control device according to claim 2, wherein the first input is connected to the node to detect a voltage drop by the resistor.

4. The over-current control device according to claim 2, wherein the comparator is an operational amplifier.

5. The over-current control device according to claim 1, wherein the over-current control device is located on a control board connected via a connection line or flexible board to a display panel comprising the OLED, wherein the control board is separated from the display panel.

6. The over-current control device according to claim 5, wherein the control board is directly connected to the supply line.

7. The over-current control device according to claim 1, wherein the interruption unit is a PMOS or NMOS transistor.

8. The over-current control device according to claim 1, wherein when the voltage on the supply line reaches the reference voltage or becomes lower than the reference voltage corresponding to the over-current, the over-current identification unit recognizes that the over-current flows through the supply line and then the interruption unit interrupts the supply of the driving voltage through the supply line.

9. A display device, comprising:
   display panel having data lines and gate lines, wherein subpixels are disposed at crossings of the data lines and gate lines;
   at least one source driver integrated circuit for supplying data signals to the data lines;
   at least one gate driver integrated circuit for supplying scanning signals to the gate lines;
   a controller for controlling the source driver IC and the gate driver IC; and
   an over-current control device comprising:
   an over-current identification unit configured to compare a driving voltage on a supply line for driving the OLED with a reference voltage on a reference voltage line for identifying the over-current;
   an interruption unit connected between the supply line supplying the driving voltage and the OLED for interrupting the power supply when the over-current identification unit recognizes an over-current flowing through the supply line; and
   a reference voltage increasing/decreasing unit for increasing or decreasing the reference voltage which is feed back to the driving voltage on a supply line; and
   a resistor directly connected between the supply line carrying the driving voltage and the interruption unit,
   wherein the interruption unit is directly connected between the resistor and the OLED.

10. The display device according to claim 9, wherein the sub-pixels include a driving transistor, an organic light emitting diode, a switching transistor, a storage capacitor and a sensing transistor, the driving transistor is connected between the supply line and the OLED and is controlled by a data voltage supplied to the gate of the driving transistor via the data line, wherein the sensing transistor is controlled by a sense signal to connect a reference voltage line with a node between the driving transistor and the OLED used for sensing a characteristic of the driving transistor.

11. The display device according to claim 9, wherein the reference voltage supplied to the second input of the comparator is the voltage applied to the sensing transistor of the subpixel.

12. The display device according to claim 9, wherein the driving voltage is provided from the control board to the display panel by passing through the data driver.

13. The display device according to claim 9, wherein the driving voltage is supplied from an external host system to the display panel comprising the OLED via the control board.

14. The display device according to claim 9, further comprising:
   a comparator having a first and second input and an output, wherein the first input is connected to a node between the resistor and the interruption unit, and the second input is connected to the reference voltage line, and wherein the output of the comparator is connected with an input of the interruption unit.

15. The display device according to claim 14, wherein the first input is connected to the node to detect a voltage drop by the resistor.

16. The display device according to claim 14, wherein the comparator is an operational amplifier.

* * * * *